(12) United States Patent
Shen et al.

(10) Patent No.: US 10,636,894 B2
(45) Date of Patent: Apr. 28, 2020

(54) FIN-TYPE TRANSISTORS WITH SPACERS ON THE GATES

(71) Applicant: GLOBALFOUNDRIES INC., Grand Cayman (KY)

(72) Inventors: Yanping Shen, Saratoga Springs, NY (US); Hui Zang, Guilderland, NY (US); Hsien-Ching Lo, Clifton Park, NY (US); Qun Gao, Clifton Park, NY (US); Jerome Ciavatti, Mechanicville, NY (US); Yi Qi, Niskayuna, NY (US); Wei Hong, Clifton Park, NY (US); Yongjun Shi, Clifton Park, NY (US); Jae Gon Lee, Waterford, NY (US); Chun Yu Wong, Ballston Lake, NY (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 35 days.

(21) Appl. No.: 15/916,323

(22) Filed: Mar. 9, 2018

(65) Prior Publication Data
US 2019/0280105 A1 Sep. 12, 2019

(51) Int. Cl.
*H01L 29/66* (2006.01)
*H01L 27/092* (2006.01)
(Continued)

(52) U.S. Cl.
CPC .......... *H01L 29/66553* (2013.01); *H01L 21/823814* (2013.01); *H01L 21/823821* (2013.01); *H01L 21/823864* (2013.01); *H01L 27/0924* (2013.01); *H01L 29/6656* (2013.01); *H01L 29/66545* (2013.01); *H01L 29/66795* (2013.01); *H01L 29/785* (2013.01); *H01L 21/823431* (2013.01); *H01L 21/823468* (2013.01); *H01L 27/0886* (2013.01)

(58) Field of Classification Search
None
See application file for complete search history.

(56) References Cited

U.S. PATENT DOCUMENTS 7,923,337 B2    4/2011    Chang et al.
8,466,034 B2    6/2013    Maszara et al.
(Continued)

*Primary Examiner* — Mounir S Amer
(74) *Attorney, Agent, or Firm* — Gibb & Riley, LLC; Francois Pagette

(57) ABSTRACT

Methods form structures that include (among other components) semiconductor fins extending from a substrate, gate insulators contacting channel regions of the semiconductor fins, and gate conductors positioned adjacent the channel regions and contacting the gate insulators. Additionally, epitaxial source/drain material contacts the semiconductor fins on opposite sides of the channel regions, and source/drain conductive contacts contact the epitaxial source/drain material. Also, first insulating spacers are on the gate conductors. The gate conductors are linear conductors perpendicular to the semiconductor fins, and the first insulating spacers are on both sides of the gate conductors. Further, second insulating spacers are on the first insulating spacers; however, the second insulating spacers are only on the first insulating spacers in locations between where the gate conductors intersect the semiconductor fins.

19 Claims, 15 Drawing Sheets

(51) Int. Cl.
   *H01L 21/8238*   (2006.01)
   *H01L 29/78*     (2006.01)
   *H01L 21/8234*       (2006.01)
   *H01L 27/088*        (2006.01)

(56) References Cited

U.S. PATENT DOCUMENTS

| | | |
|---|---|---|
| 8,703,556 B2 | 4/2014 | Kelly et al. |
| 8,846,477 B2 | 9/2014 | Cai et al. |
| 9,754,798 B1 | 9/2017 | Bi et al. |
| 2015/0255571 A1* | 9/2015 | Xu .................... H01L 29/6681 257/288 |

* cited by examiner

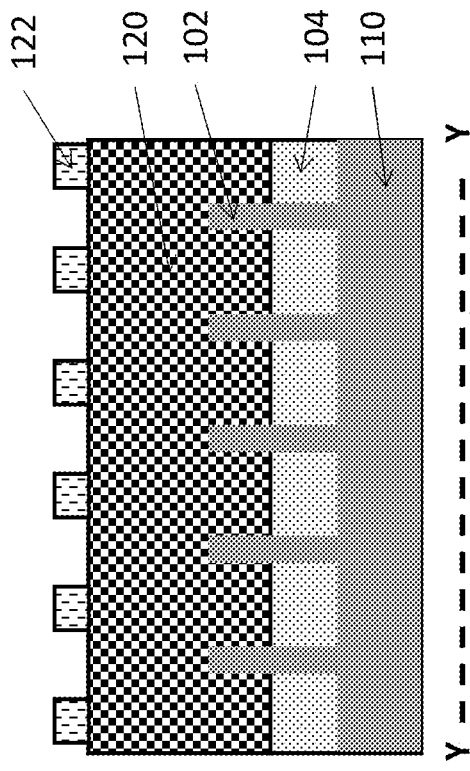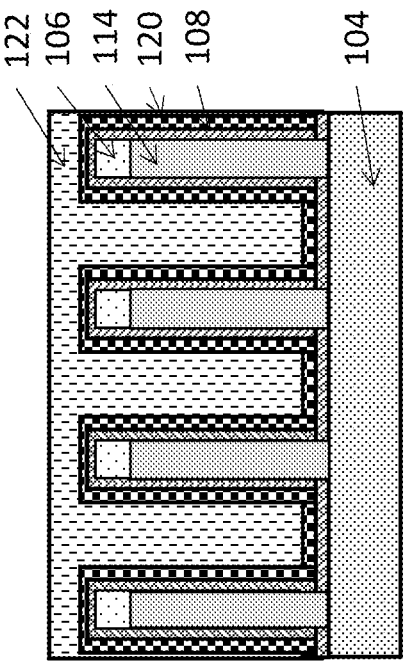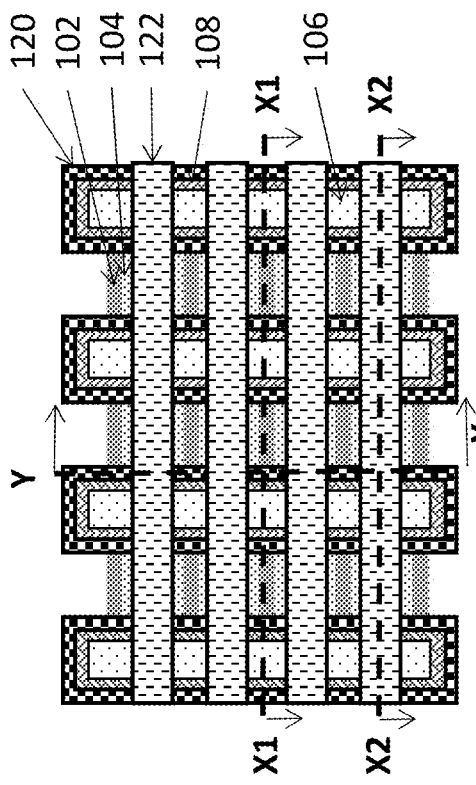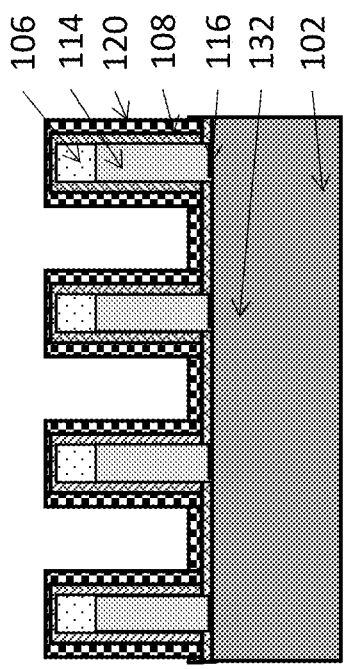
Figure 3A
Figure 3B
Figure 3C
Figure 3D

FIN-TYPE TRANSISTORS WITH SPACERS ON THE GATES

BACKGROUND

Field of the Invention

The present disclosure relates to integrated circuit structures and methods, and more specifically, to methods that form fin-type transistors with spacers between the gates and adjacent contacts.

Description of Related Art

Integrated circuit devices use transistors for many different functions, and these transistors can take many different forms, from planar transistors, to transistors that use a "fin" style structure. A fin of a fin-type transistor is a thin, long, six-sided rectangle that extends from a substrate, with sides that are longer than they are wide, a top and bottom that have the same length as the sides (but that have a width that is much more narrow), and ends that are as tall from the substrate as the width of the sides, but that are only as wide as the as the top and bottom.

With constant reductions in size (scaling) of integrated circuit devices, such as complementary metal oxide semiconductor (CMOS) technologies, the transistor direct current (DC) performance is continuously being improved. However, parasitic capacitance increases with scaled critical dimensions (CD), which leads to serious degradation of chip operation speed.

SUMMARY

Various methods herein pattern a substrate to form semiconductor fins extending from the substrate. Gate insulators are then formed/grown on the channel regions of the semiconductor fins, and sacrificial gates are formed/patterned on the gate insulators, adjacent the channel regions. The sacrificial gates are patterned to be perpendicular to the semiconductor fins, and to thereby intersect the semiconductor fins (but separated from the semiconductor fins by the gate insulators).

These methods also form first and second insulating spacers (e.g., low-K insulators) on the sacrificial gates, and then pattern the second insulating spacers to leave the second insulating spacers only on the first insulating spacers in locations between where the sacrificial gates intersect the semiconductor fins. Also, such methods epitaxially grow source/drain material on the semiconductor fins on opposite sides of the channel regions. These methods replace the sacrificial gates with gate conductors, and form source/drain conductive contacts to the epitaxial source/drain material. In different embodiments, the second insulating spacers contact either the source/drain conductive contacts or the gate conductors.

The first insulating spacers and the second insulating spacers are on both sides of the gate conductors. The process of patterning the second insulating spacers causes both the first insulating spacers and the second insulating spacers to separate the gate conductors and the source/drain conductive contacts in the locations between where the gate conductors intersect the semiconductor fins, but only the first insulating spacers separate the gate conductors and the source/drain conductive contacts in the locations where the gate conductors intersect the semiconductor fins. Therefore, the first insulating spacers and the second insulating spacers together cause a greater spacing around the gate conductors (e.g., between the gate conductors and the source/drain conductive contacts), relative to the first insulating spacers alone. Also, the process of patterning the second insulating spacers causes the first insulating spacers to continuously contact the gate conductors along the full length of the gate conductors, and the second insulating spacers to discontinuously contact the first insulating spacers along the full length of the gate conductors.

Various structures herein include (among other components) semiconductor fins extending from a substrate, gate insulators contacting channel regions of the semiconductor fins, and gate conductors positioned adjacent the channel regions and contacting the gate insulators. Additionally, epitaxial source/drain material contacts the semiconductor fins on opposite sides of the channel regions, and source/drain conductive contacts contact the epitaxial source/drain material.

Also, first insulating spacers are on the gate conductors. The gate conductors are linear conductors perpendicular to the semiconductor fins, and the first insulating spacers are on both sides of the gate conductors. Further, second insulating spacers are on the first insulating spacers; however, the second insulating spacers are only on the first insulating spacers in locations between where the gate conductors intersect the semiconductor fins. The first insulating spacers and the second insulating spacers are low-K insulators, and in different embodiments, the second insulating spacers contact either the source/drain conductive contacts or the gate conductors. Also, the first insulating spacers and the second insulating spacers can be either the same insulator, or different insulators.

Thus, both the first insulating spacers and the second insulating spacers separate the gate conductors and the source/drain conductive contacts in the locations between where the gate conductors intersect the semiconductor fins, but only the first insulating spacers separate the gate conductors and the source/drain conductive contacts in the locations where the gate conductors intersect the semiconductor fins. The first insulating spacers continuously contact the gate conductors along full lengths of the gate conductors, and wherein the second insulating spacers discontinuously contact the first insulating spacers along the along full lengths of the gate conductors. The first insulating spacers and the second insulating spacers together cause a greater spacing on the sides of the gate conductors (e.g., between the gate conductors and the source/drain conductive contacts), relative to the first insulating spacers alone.

BRIEF DESCRIPTION OF THE DRAWINGS

The embodiments herein will be better understood from the following detailed description with reference to the drawings, which are not necessarily drawn to scale and in which:

FIG. 3A is a top-view schematic diagram illustrating an integrated circuit structure according to embodiments herein;

FIGS. 3B-3D are side-view schematic diagrams illustrating the integrated circuit structure shown in FIG. 3A along different cross-sections;

DETAILED DESCRIPTION

As mentioned above, with scaling of CMOS technology devices, the transistor DC performance is continuously being improved. However, parasitic capacitance increases with scaled CD, which leads to serious degradation of chip operation speed. There are several components in FET parasitic capacitance (e.g., capacitance between gate to epi-source/drain and gate-to-through silicon via (TS), etc.). In self-align-contact (SAC) structures, the gate is very close to the source/drain contact (e.g., the TS), and structures are only separated by spacers. A thicker spacer can significantly reduce the parasitic capacitance; however, an increase in spacer thickness decreases DC performance.

In view of this, the methods and devices disclosed herein provide a spacer structure which significantly reduced the front end of line (FEOL) parasitic capacitance without DC performance degradation. FEOL processing involves the actual making of chip layers that have active devices, such as transistors, diodes, resistors, capacitors, etc., and is performed before the back end of line (BEOL) processing which forms power and signal connections to the FEOL devices.

More specifically, processing herein uses two spacers (one continuous, one discontinuous) to separate the metal gate and the source/drain contact, to reduce FEOL parasitic capacitance, without DC performance degradation. Therefore, in some locations two spacers are present between the metal gate and the source/drain contact, while in other locations (where the gate intersects the fin) only one spacer is present between the metal gate and the source/drain contact. The spacers are generally low-K insulators, and can be formed of the same material or different materials.

For example, in one structure, an outer spacer is discontinuous and is not present in locations where the gates intersect the fins (but is present along the portions of the gate conductor that are between the fins). In another structure, the inner spacer is discontinuous, in the same locations. Where both spacers are present (in areas away from the fins (e.g., between the fins)), this double-spacer structure increases the amount of electrical insulation between the gate and the through silicon via source/drain contact (to reduce parasitic capacitance); however, where only one spacer is present (in areas where the gate intersects the fin) the structure does not increase the amount of electrical insulation, which allows the gate conductor to have unreduced effect on the channel region of the fin, to avoid affecting DC performance.

Figure 6:
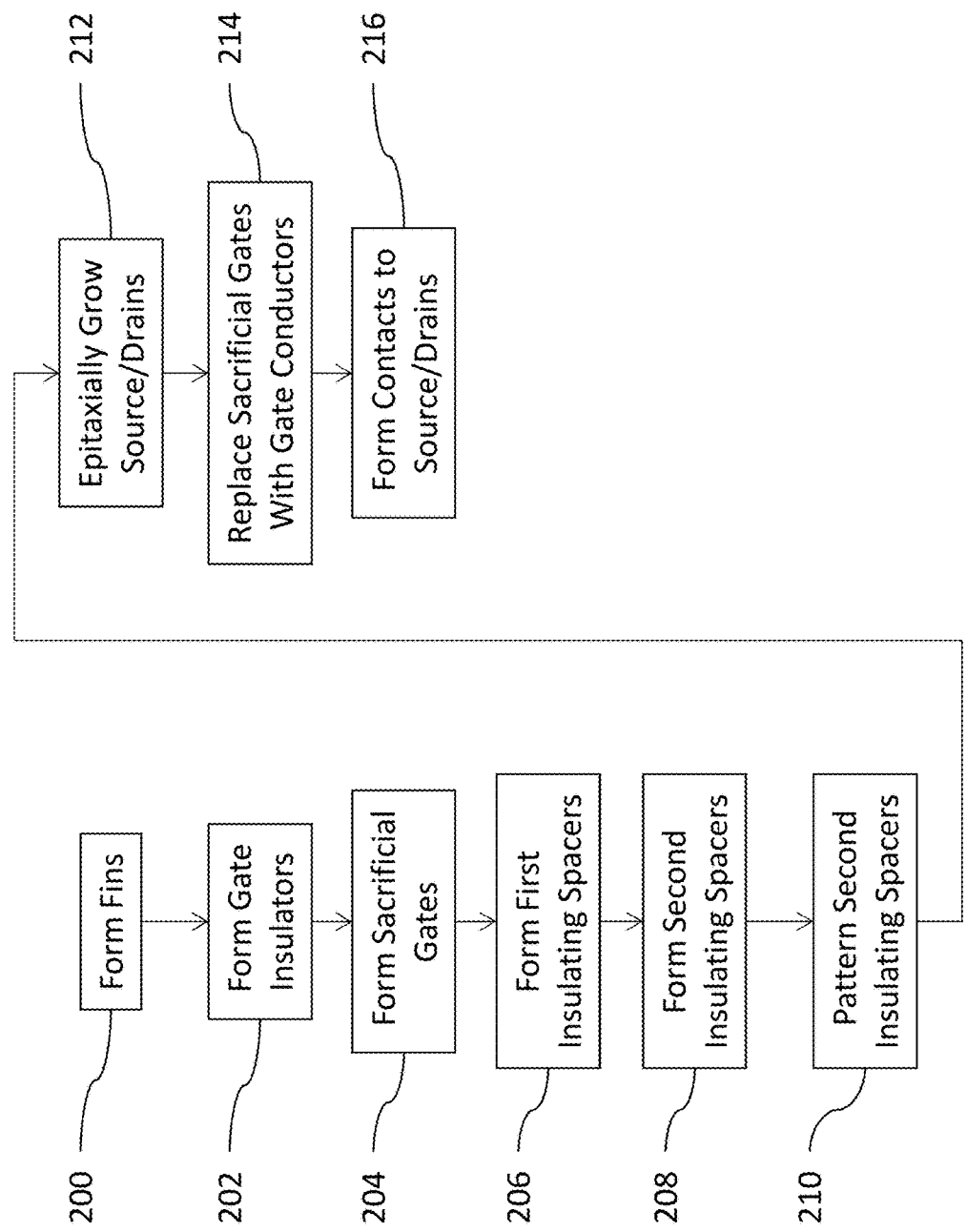
FIG. 6 is a flow diagram illustrating the processing shown in FIGS. 1A-5D.

FIGS. 1A-6 illustrate various methods herein. More specifically, FIG. 6 is a flow diagram illustrating the processing shown in FIGS. 1A-5D, FIGS. 1A, 2A, 3A, 4A, and 5A are top-view schematic diagrams illustrating an integrated circuit structure according to embodiments herein, FIGS. 1B, 2B, 3B, 4B, and 5B are side-view schematic diagrams illustrating the integrated circuit structure shown in FIGS. 1A, 2A, 3A, 4A, and 5A along cross-section Y-Y, FIGS. 1C, 2C, 3C, 4C, and 5C are side-view schematic diagrams illustrating the integrated circuit structure shown in FIGS. 1A, 2A, 3A, 4A, and 5A along cross-section X1-X1, and FIGS. 1D, 2D, 3D, 4D, and 5D are side-view schematic diagrams illustrating the integrated circuit structure shown in FIGS. 1A, 2A, 3A, 4A, and 5A along cross-section X2-X2.

Figure 1A:
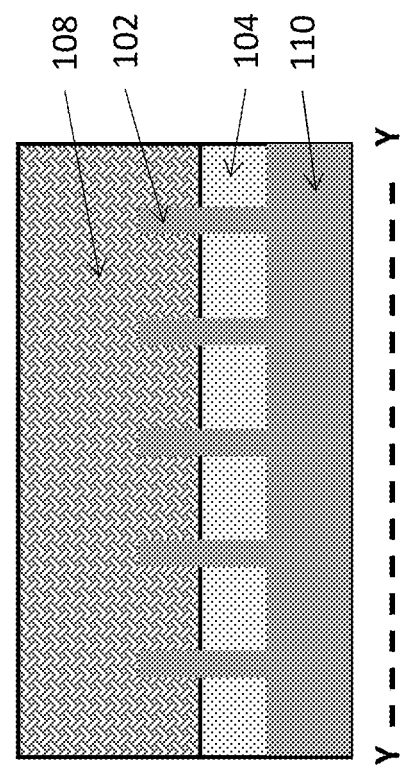
FIG. 1A is a top-view schematic diagram illustrating an integrated circuit structure according to embodiments herein.
Figure 1B:
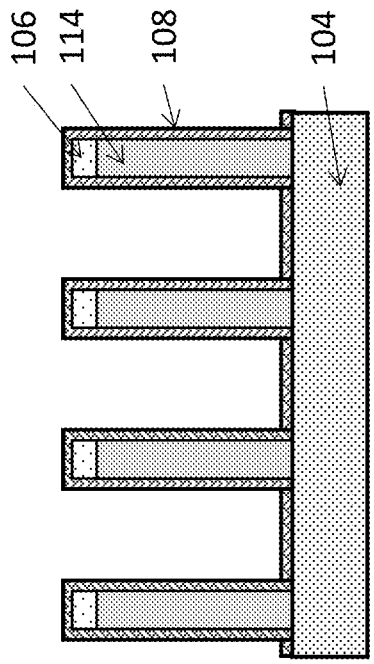
FIGS. 1B-1D are side-view schematic diagrams illustrating the integrated circuit structure shown in FIG. 1A along different cross-sections.
Figure 1C:
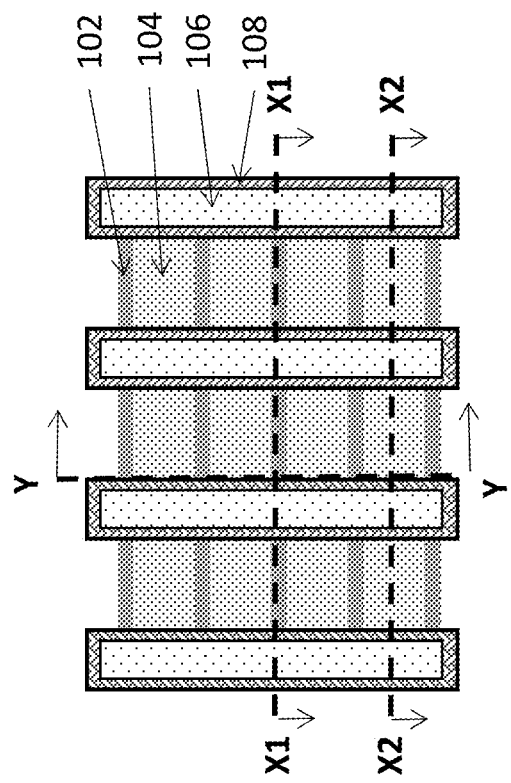
Figure 1D:
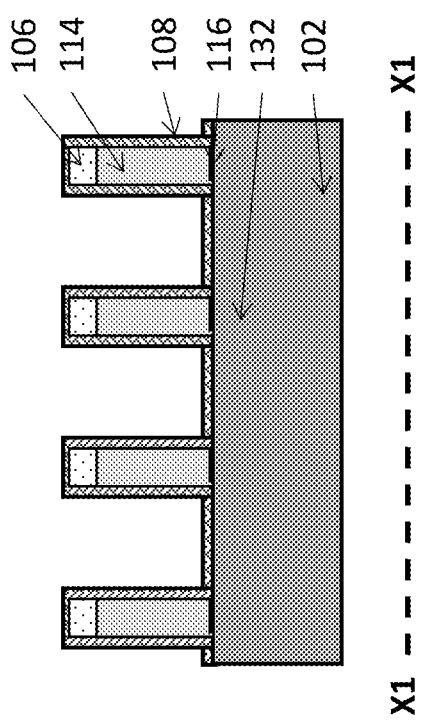
Figure 2A:
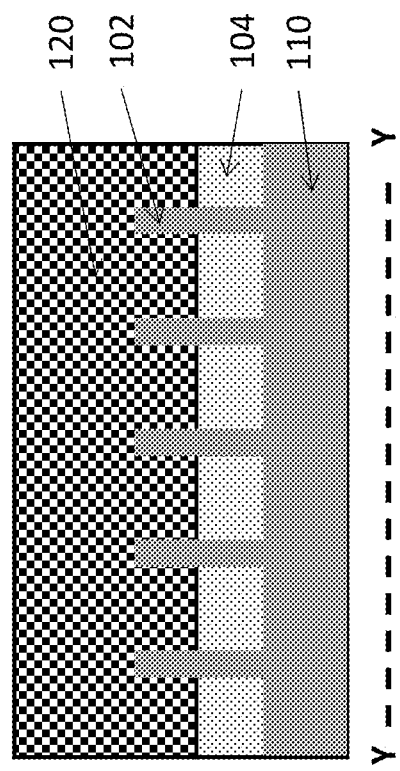
FIG. 2A is a top-view schematic diagram illustrating an integrated circuit structure according to embodiments herein.
Figure 2C:
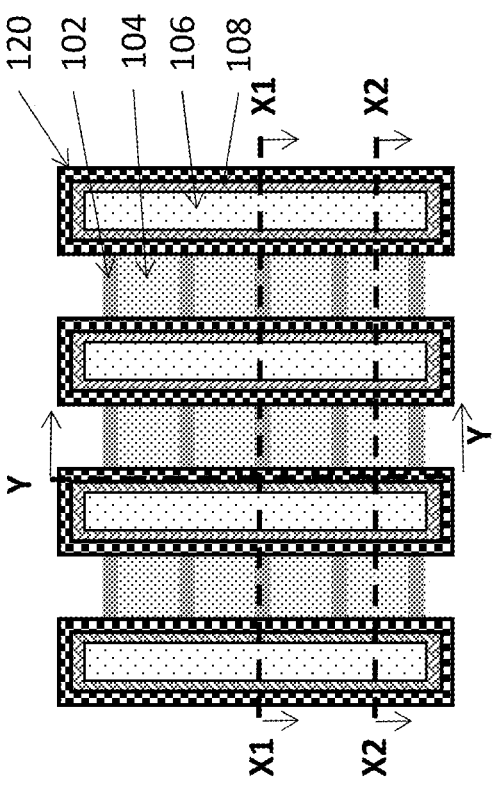
FIGS. 2B-2D are side-view schematic diagrams illustrating the integrated circuit structure shown in FIG. 2A along different cross-sections.
Figure 2B:
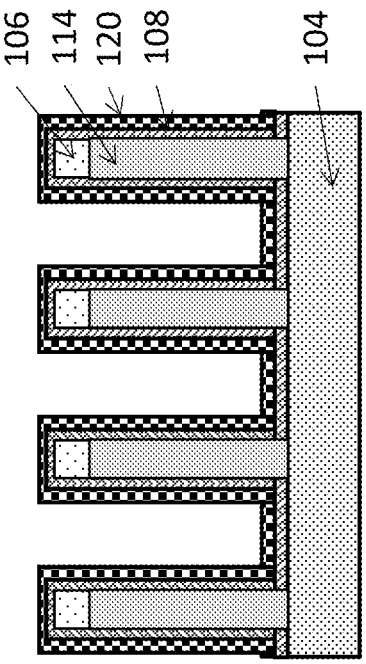
Figure 2D:
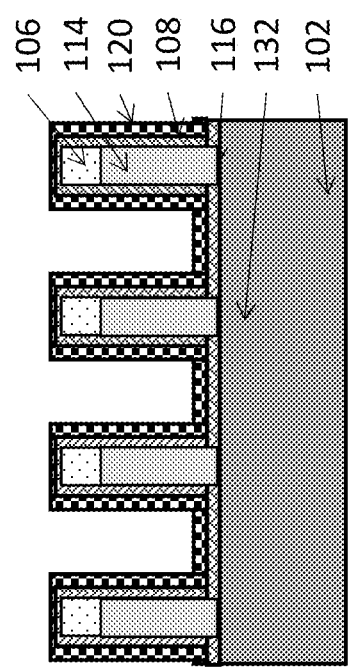
Figure 4A:
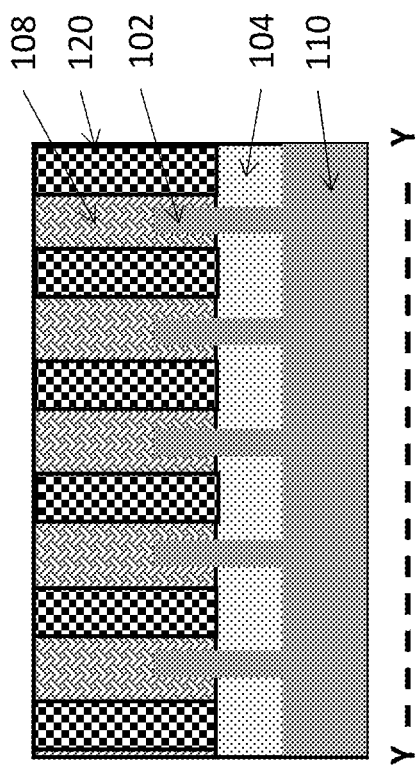
FIG. 4A is a top-view schematic diagram illustrating an integrated circuit structure according to embodiments herein.
Figure 4B:
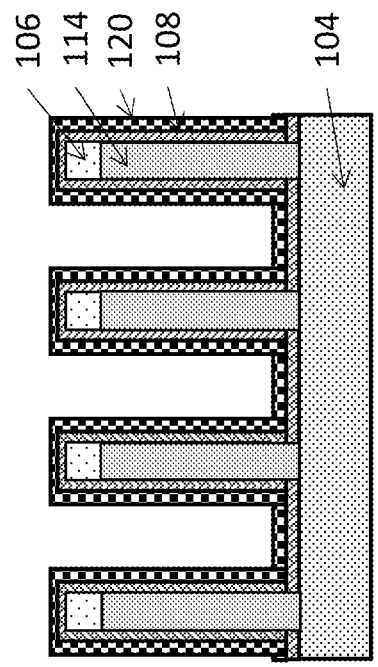
FIGS. 4B-4D are side-view schematic diagrams illustrating the integrated circuit structure shown in FIG. 4A along different cross-sections.
Figure 4C:
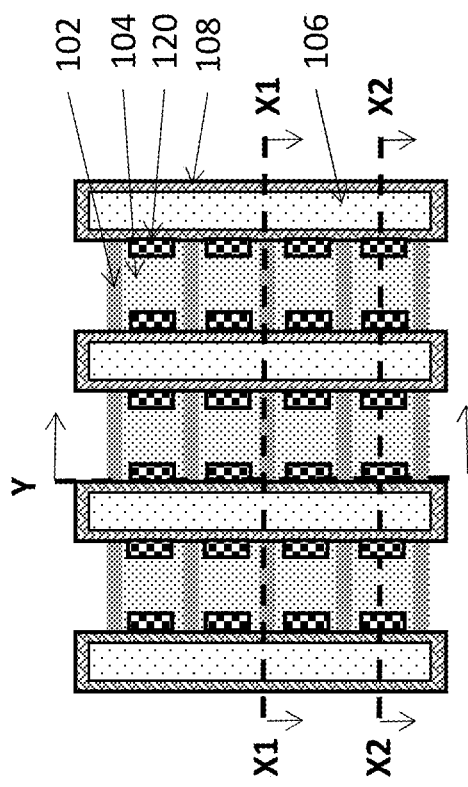
Figure 4D:
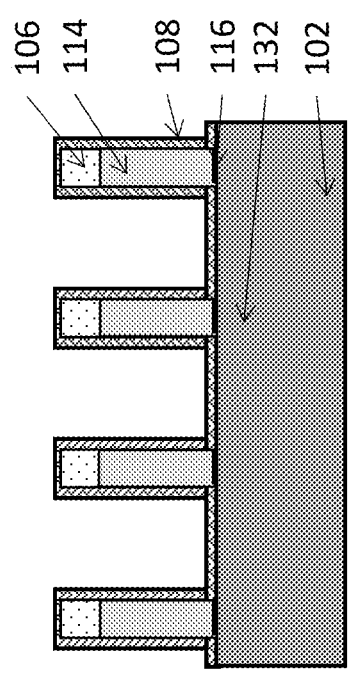
Figure 5A:
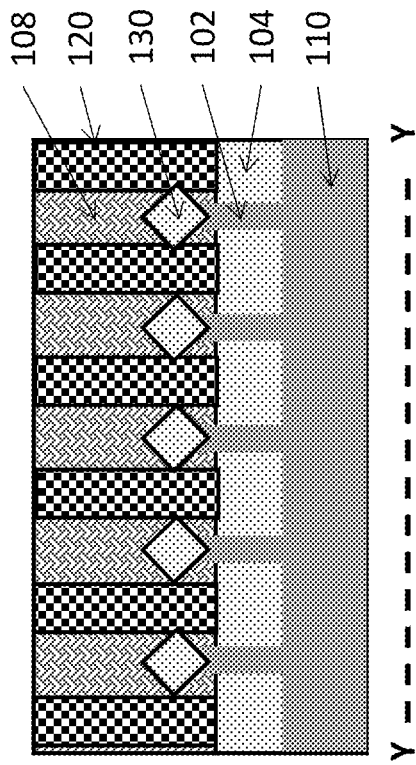
FIG. 5A is a top-view schematic diagram illustrating an integrated circuit structure according to embodiments herein.
Figure 5B:
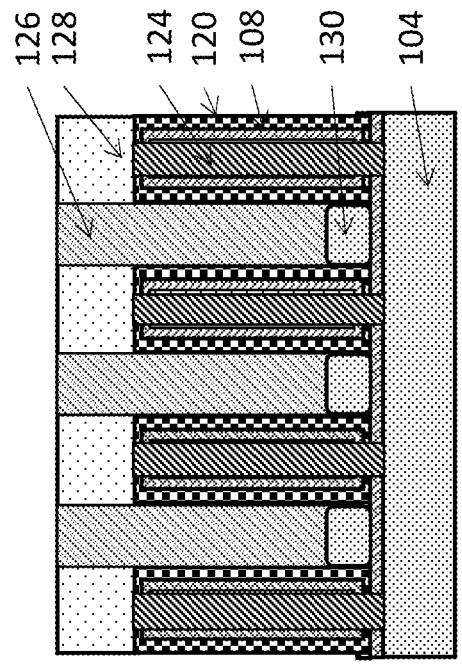
FIGS. 5B-5D are side-view schematic diagrams illustrating the integrated circuit structure shown in FIG. 5A along different cross-sections.
Figure 5C:
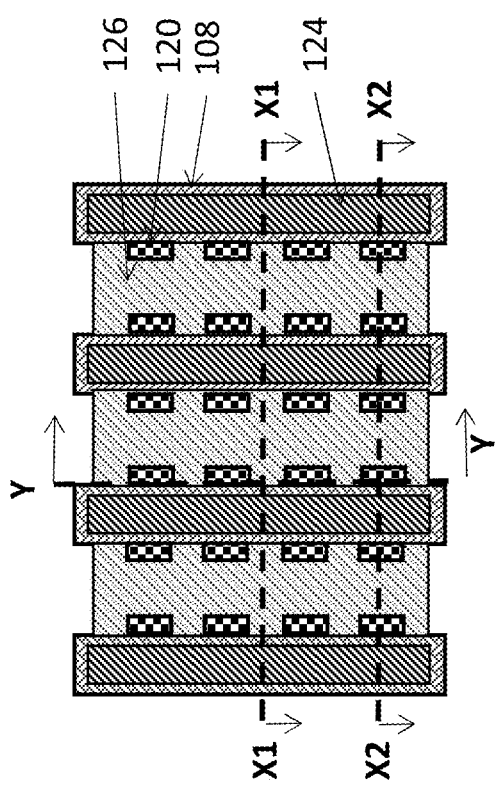
Figure 5D:
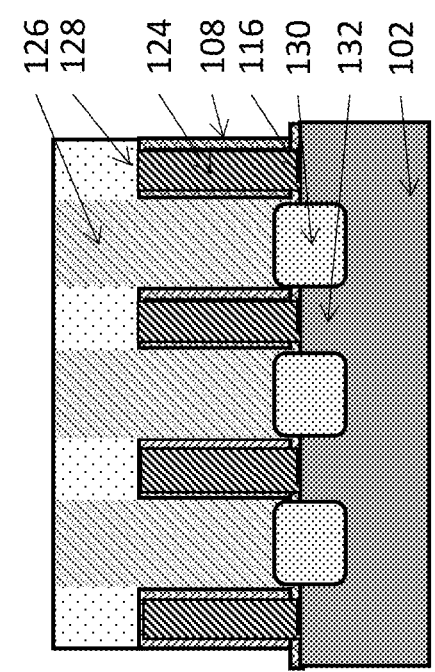

Therefore, as shown in FIGS. 1A-1D and 6, in item 200, these methods pattern a substrate 110 (e.g., silicon substrate, that can be doped or an in-situ semiconductor) to form semiconductor fins 102 extending from the substrate 110, and form an insulator (e.g., oxide) 104 around the fins, as most clearly shown in FIGS. 1A-1B. In item 202, gate insulators 116 (shown in FIG. 1C) are then formed/grown on the channel regions 132 of the semiconductor fins 102, and sacrificial gates 114 (shown in FIGS. 1C-1D), which can be, for example, polysilicon, are formed/patterned on the gate insulators 116, adjacent the channel regions 132 in item 204. As shown in FIG. 1A, the sacrificial gates 114 which are below the overlying gate caps 106 (e.g., silicon nitride) are patterned in item 204 to be perpendicular to the semiconductor fins 102, and to thereby intersect the semiconductor fins 102 (but are separated from the semiconductor fins 102 by the gate insulators 116).

These methods also form first insulating spacers 108 (such as a nitride, or other low-K material) on the sacrificial gates 114, in item 206, as shown in FIGS. 1A-1D. As shown in FIGS. 2A-2D, these methods form second insulating spacers 120 (such as an oxide, or other low-K material) on the first insulating spacers 108 in item 208. As shown in FIGS. 3A-3D, photoresist masks 122 are used to pattern the second insulating spacers 120 in item 210. More specifically, the first and second insulating spacers 108 and 120 can be different low-K insulators, allowing the second insulating spacers 108 to be selectively removed, without affecting the first insulating spacers 108. After the mask 122 is removed, as shown in FIGS. 4A-4D, this leaves the second insulating spacers 120 only on the first insulating spacers 108 in locations between where the sacrificial gates 114 intersect the semiconductor fins 102.

As shown in FIGS. 5A-5D, and in item 212, such methods epitaxially grow source/drain material 130 on the semiconductor fins 102 on opposite sides of the channel regions 132. These methods also replace the sacrificial gates 114 with gate conductors 124 (e.g., metal, such as tungsten) in item 214, and form source/drain conductive contacts 126 to the epitaxial source/drain material 130 in item 216. Additionally, an overlying insulator 128 is formed.

As can be seen in FIGS. 5A-5D, the first insulating spacers 108 and the second insulating spacers 120 are between the gate conductors 124 and the source/drain conductive contacts 126. The process of patterning the second insulating spacers 120 in item 210 (FIGS. 3A-3D) causes both the first insulating spacers 108 and the second insulating spacers 120 to separate the gate conductors 124 and the source/drain conductive contacts 126 in the locations between where the gate conductors 124 intersect the semiconductor fins 102, but only the first insulating spacers 108 to separate the gate conductors 124 and the source/drain conductive contacts 126 in the locations where the gate conductors 124 intersect the semiconductor fins 102.

Therefore, as shown in FIGS. 5A-5D, the first insulating spacers 108 and the second insulating spacers 120 together cause a greater spacing on the sides of the gate conductors 124 (e.g., between the gate conductors 124 and the source/drain conductive contacts 126), relative to the spacing provided by the first insulating spacers 108 alone. Also, the process of patterning the second insulating spacers 120 in item 210 causes the first insulating spacers 108 to continuously contact the gate conductors 124 along the full length of the gate conductors 124, and the second insulating spacers 120 to discontinuously contact the first insulating spacers 108 along the full length of the gate conductors 124.

Figure 7A:
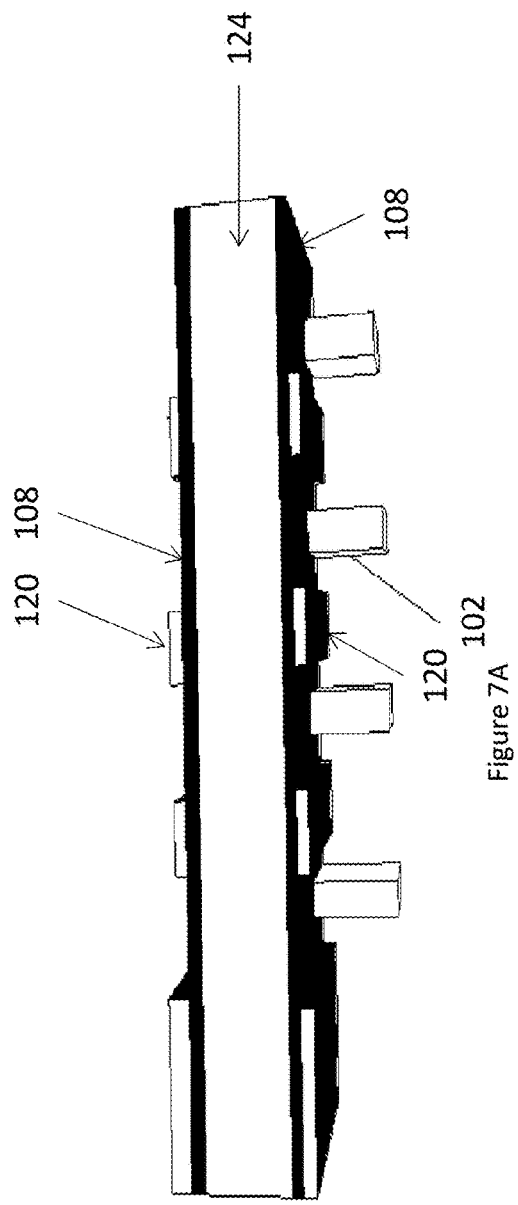
FIGS. 7A and 7B are perspective schematic diagrams illustrating the integrated circuit structure shown in FIG. 5A-5D
Figure 7B:
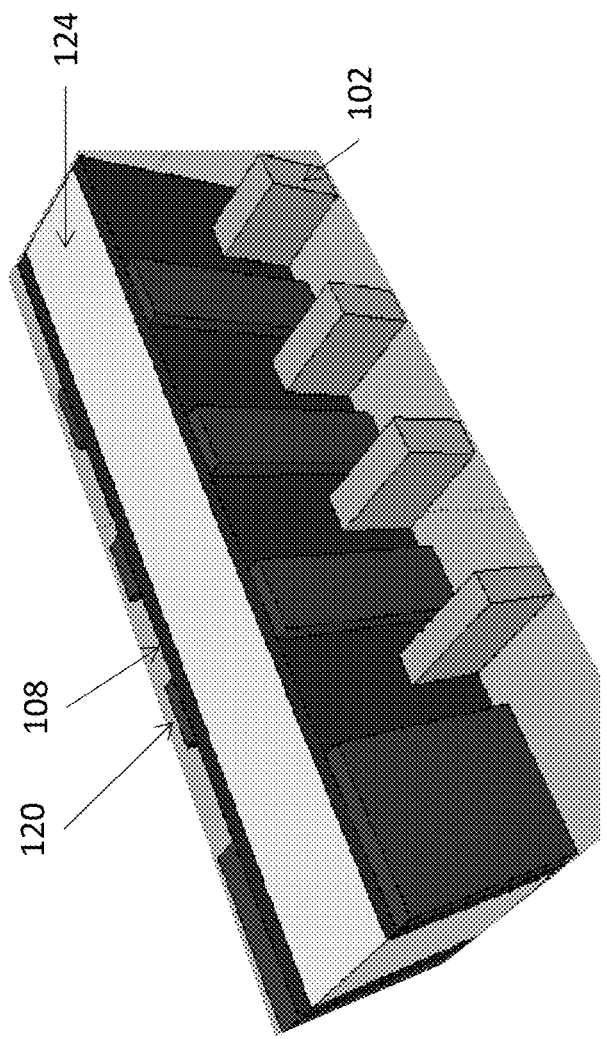
Figure 8A:
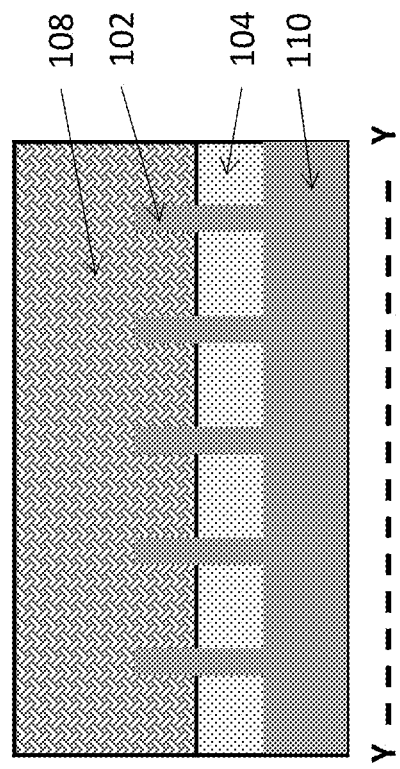
FIG. 8A is a top-view schematic diagram illustrating an integrated circuit structure according to embodiments herein.
Figure 8B:
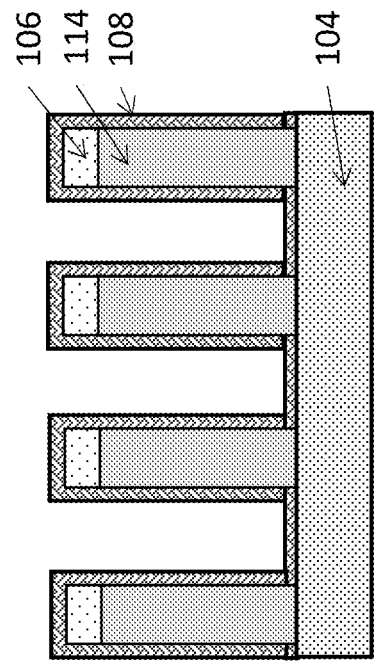
FIGS. 8B-8D are side-view schematic diagrams illustrating the integrated circuit structure shown in FIG. 8A along different cross-sections.
Figure 8C:
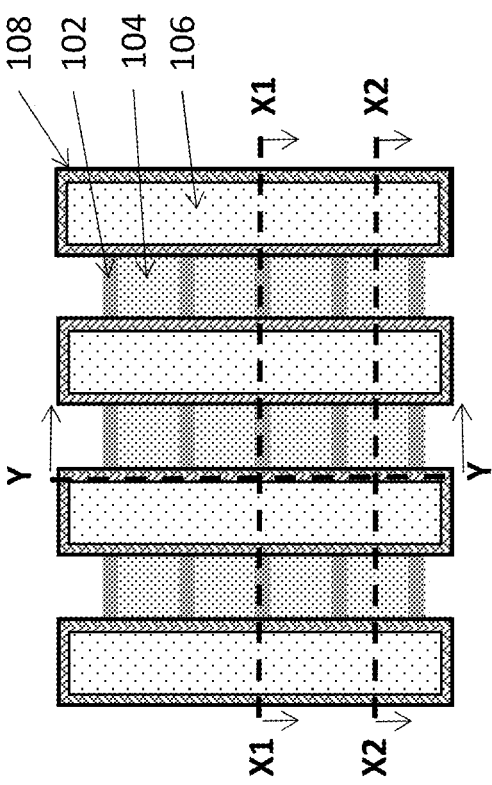
Figure 8D:
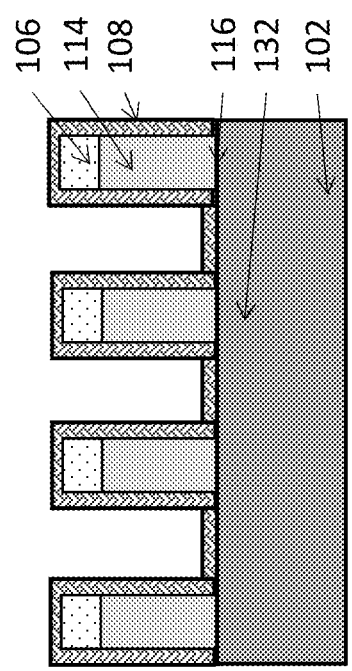
Figure 9A:
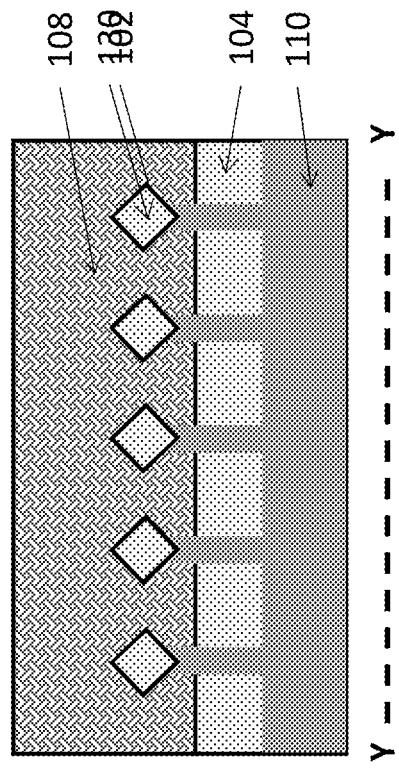
FIG. 9A is a top-view schematic diagram illustrating an integrated circuit structure according to embodiments herein.
Figure 9C:
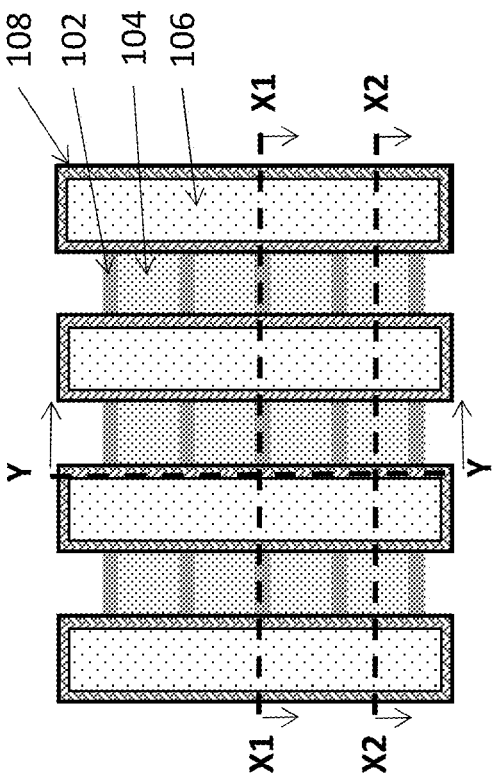
FIGS. 9B-9D are side-view schematic diagrams illustrating the integrated circuit structure shown in FIG. 9A along different cross-sections.
Figure 9B:
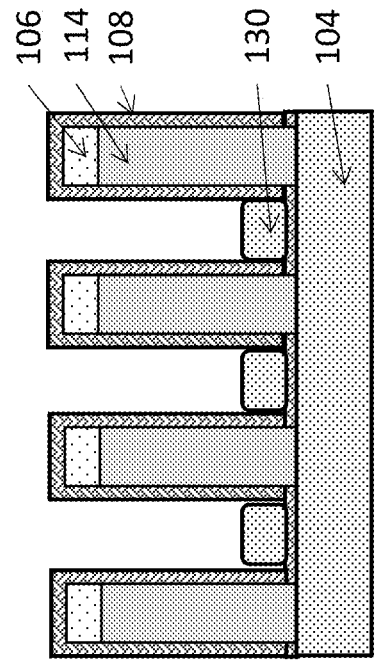
Figure 9D:
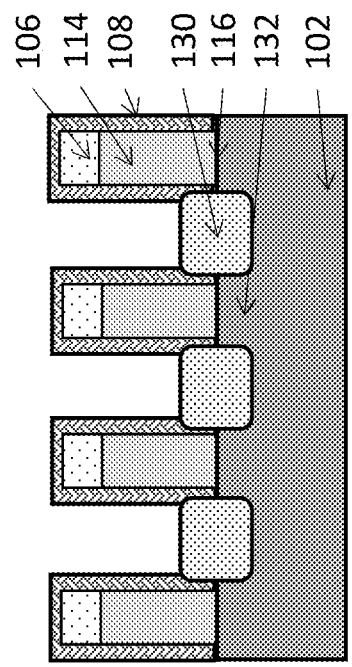
Figure 10A:
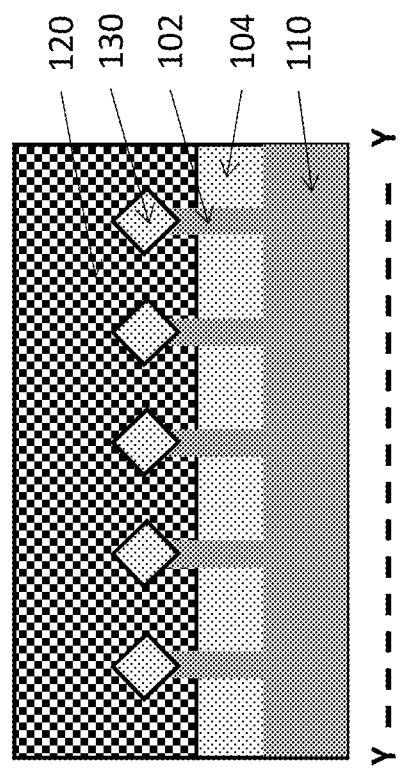
FIG. 10A is a top-view schematic diagram illustrating an integrated circuit structure according to embodiments herein.
Figure 10B:
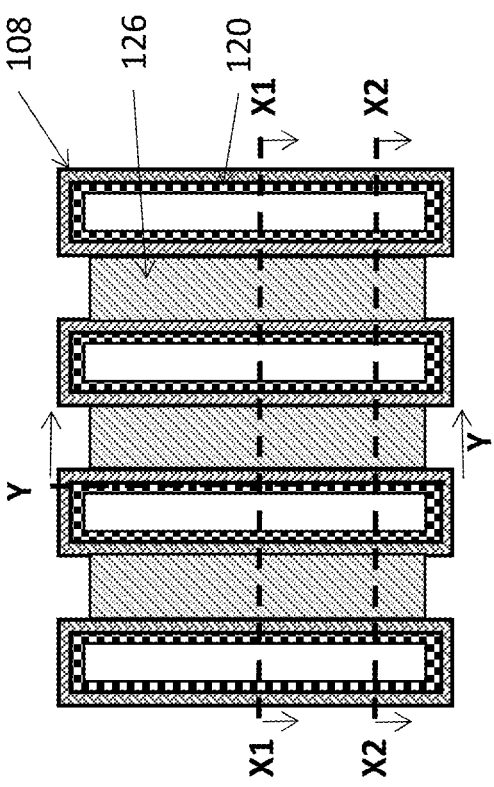
FIGS. 10B-10D are side-view schematic diagrams illustrating the integrated circuit structure shown in FIG. 10A along different cross-sections.
Figure 10C:
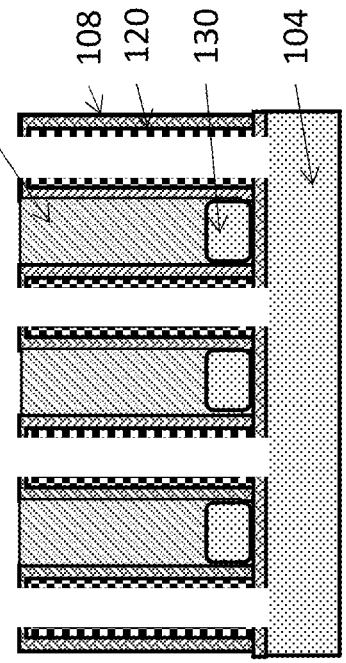
Figure 10D:
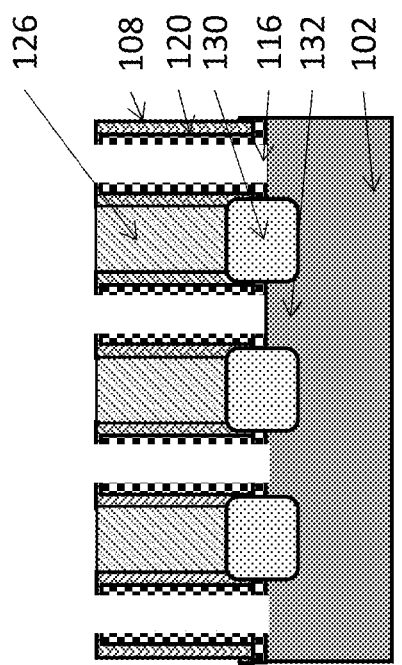
Figure 11A:
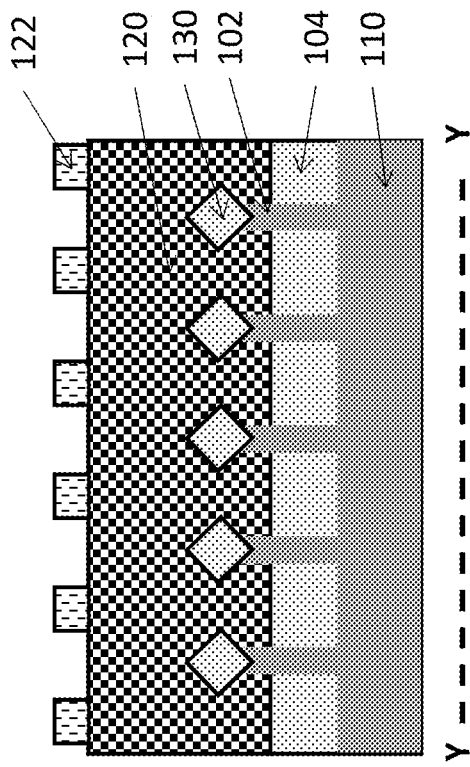
FIG. 11A is a top-view schematic diagram illustrating an integrated circuit structure according to embodiments herein.
Figure 11B:
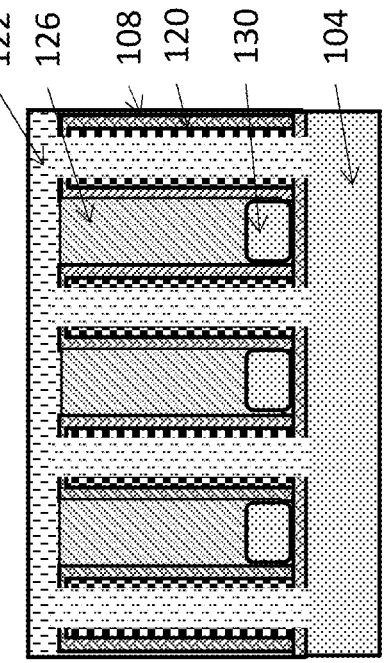
FIGS. 11B-11D are side-view schematic diagrams illustrating the integrated circuit structure shown in FIG. 11A along different cross-sections.
Figure 11C:
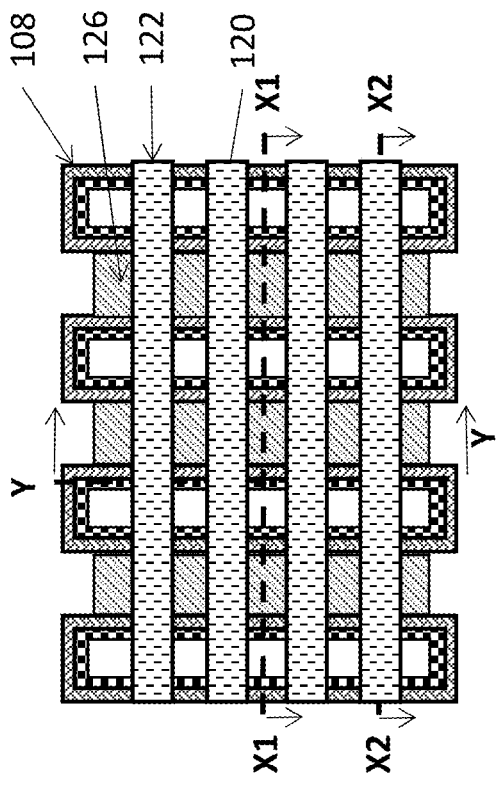
Figure 11D:
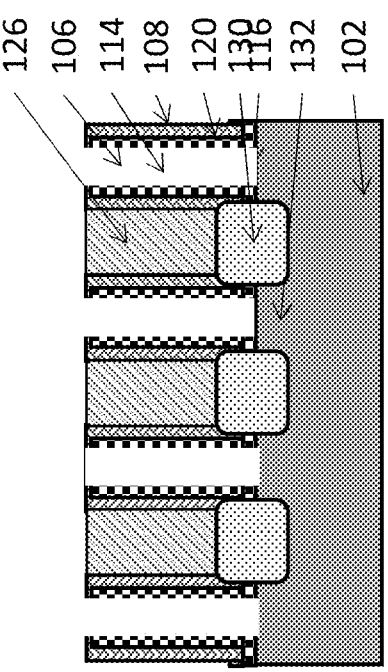
Figure 12A:
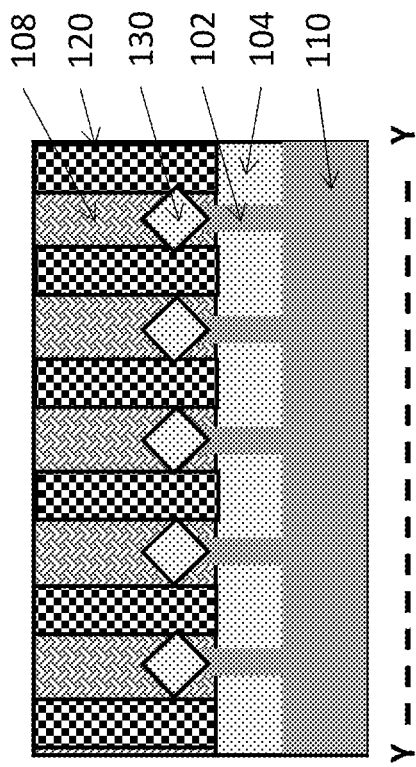
FIG. 12A is a top-view schematic diagram illustrating an integrated circuit structure according to embodiments herein.
Figure 12B:
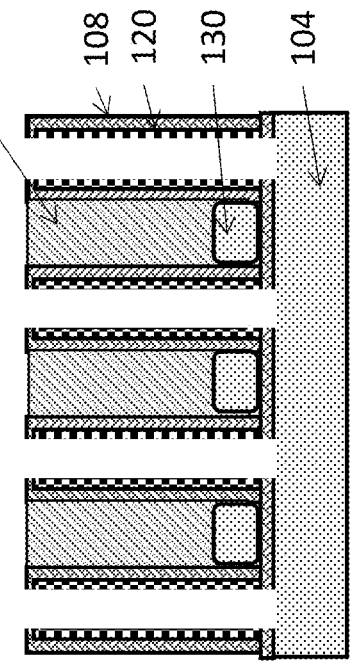
FIGS. 12B-12D are side-view schematic diagrams illustrating the integrated circuit structure shown in FIG. 12A along different cross-sections.
Figure 12C:
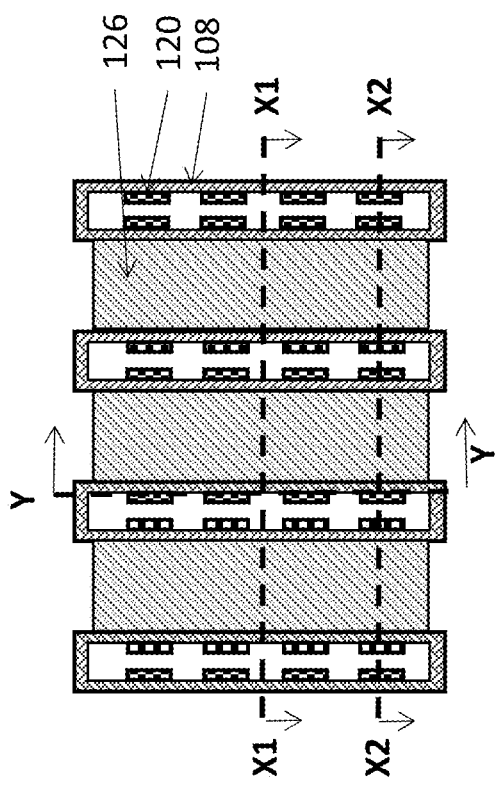
Figure 12D:
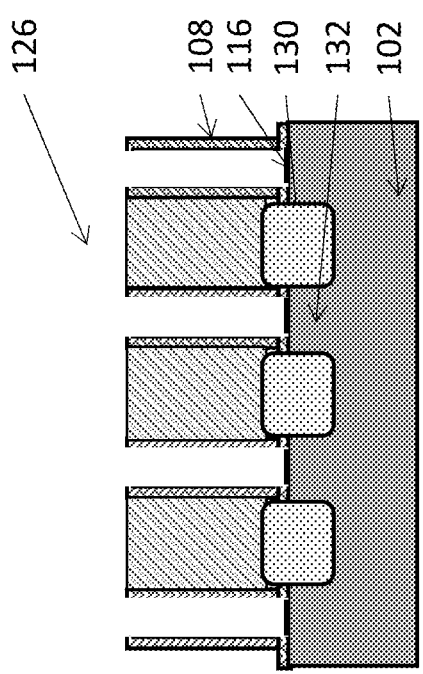
Figure 13A:
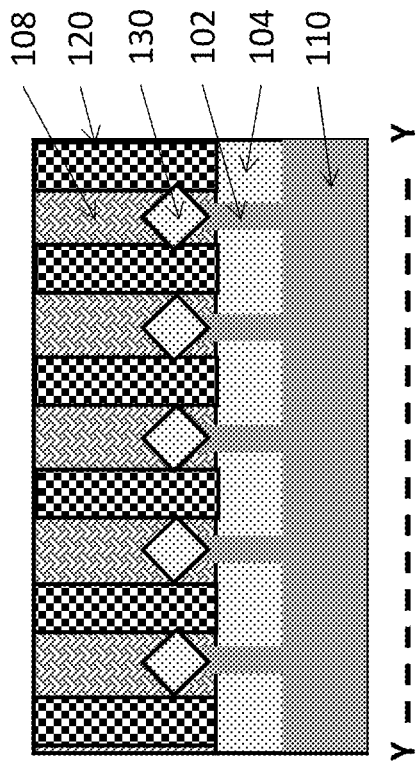
FIG. 13A is a top-view schematic diagram illustrating an integrated circuit structure according to embodiments herein.
Figure 13B:
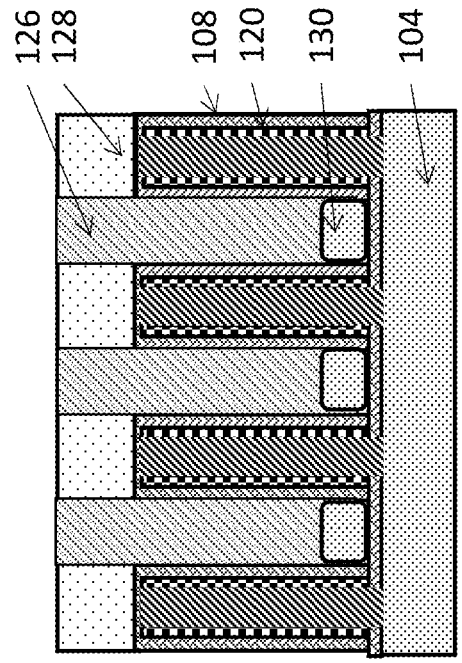
FIGS. 13B-13D are side-view schematic diagrams illustrating the integrated circuit structure shown in FIG. 13A along different cross-sections.
Figure 13C:
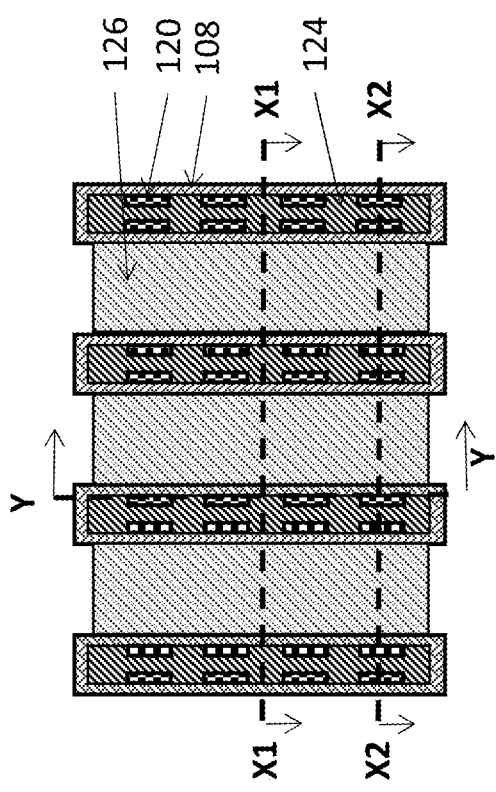
Figure 13D:
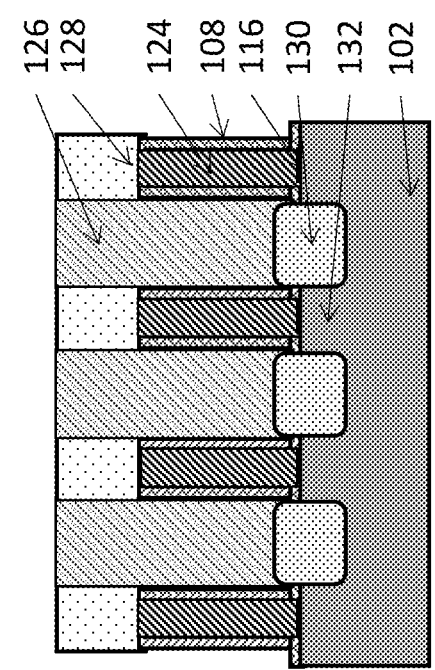
Figure 14:
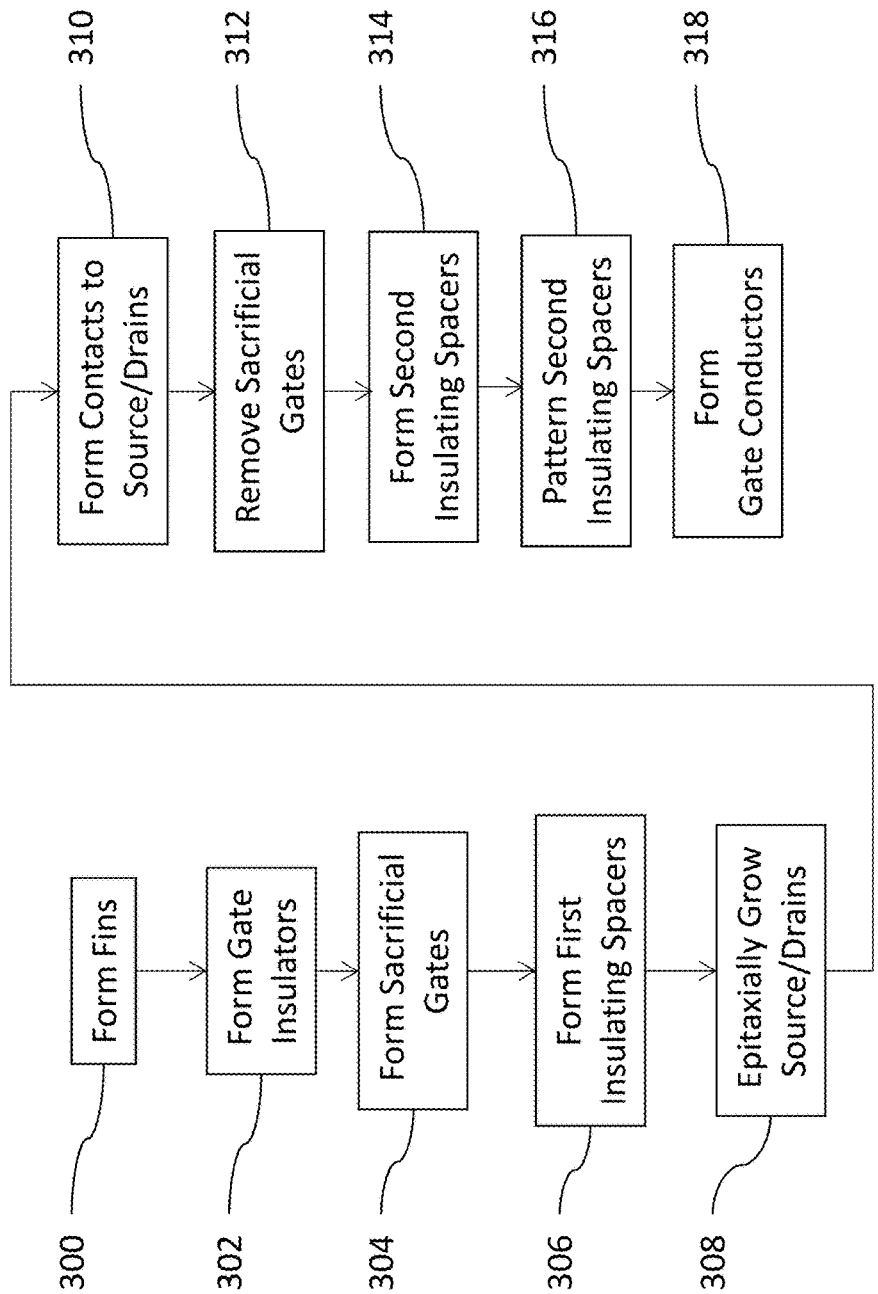
FIG. 14 is a flow diagram illustrating the processing shown in FIGS. 1A-5D.

Also, FIGS. 7A and 7B are perspective schematic diagrams illustrating the gate conductors 124 with the continuous spacer 108, and the discontinuous spacer 120 and the fins 102. As shown in FIGS. 7A and 7B the first insulating spacers 108 continuously contact the gate conductors 124 along the full length of sides of the gate conductors 124 between the fins, and the second insulating spacers 120 discontinuously contact the first insulating spacers 108 along the full length of the gate conductors 124. Here the "sides" of the gate conductors 124 are the relatively longer and wider surfaces of the gate conductors 124 that face the source/drain conductive contacts 126; and the "full length" is the continuous linear portion of the gate conductors 124 that periodically intersects (runs perpendicular to) a group (cell) of the semiconductor fins 102.

As noted above, the second insulating spacers 120 can alternatively contact the gate conductors 124, and the processing to achieve such a structure is shown in FIGS. 8A-14. The processing shown in FIGS. 8A-14 is the same as that discussed above, and is presented in the drawings from the same views, except in the following aspects (and a redundant discussion of the identical processes is avoided for brevity). Therefore, as shown in FIGS. 8A-8D and 14, the fins are formed (300, FIG. 14), the gate insulator is formed (302), the sacrificial gates are formed (304), and the first insulating spacers 108 are formed on the second insulating spacers 120 (306).

In FIGS. 9A-9D, the aforementioned source/drain material 130 is epitaxially grown on the semiconductor fins 102 (308), and the same source/drain conductive contacts 126 are partially formed (310). In other alternatives, items 126 could be a sacrificial material (e.g., nitride, etc.) that provides sufficient structural support for the following steps.

FIGS. 10A-10D show that the sacrificial gates 114 and gate caps 106 are removed using selective chemical removal and/or etching with masking (312), the second insulating spacers 120 are then formed on the sacrificial gates 114 (314). Then, as shown in FIGS. 11A-11D a mask 122 (similar to that discussed above) is patterned over the structure. Following this, the exposed portions of the second insulator spacers 120 not protected by the mask 122 are removed (e.g., in an etching process) to pattern the second insulating spacers 120 (316).

The mask 122 is removed, resulting in the structure shown in the various views in FIGS. 12A-12D. As shown in FIGS. 13A-13D, the source/drain conductive contacts 126 are completed, or alternatively, if a sacrificial material was used in place of the partial source/drain conductive contacts 126, that sacrificial material is removed and replaced with metal conductor to form (or complete) the source/drain conductive contacts 126. Also, FIGS. 13A-13D show that the gate conductors 124 are formed (318), followed by an overlying insulator 128, as discussed above.

Figure 15A:
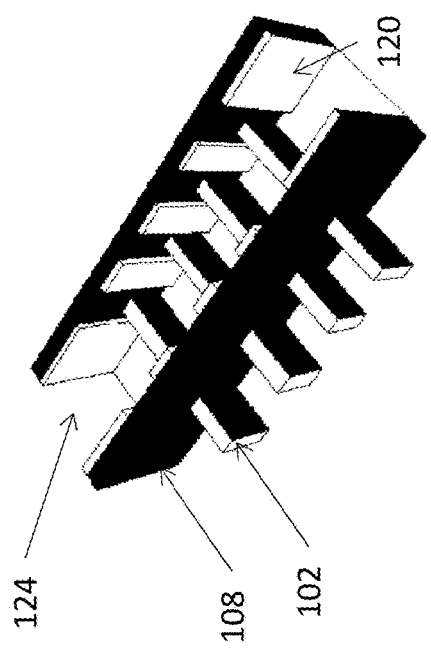
FIGS. 15A and 15B are perspective schematic diagrams illustrating the integrated circuit structure shown in FIG. 13A-13D.
Figure 15B:
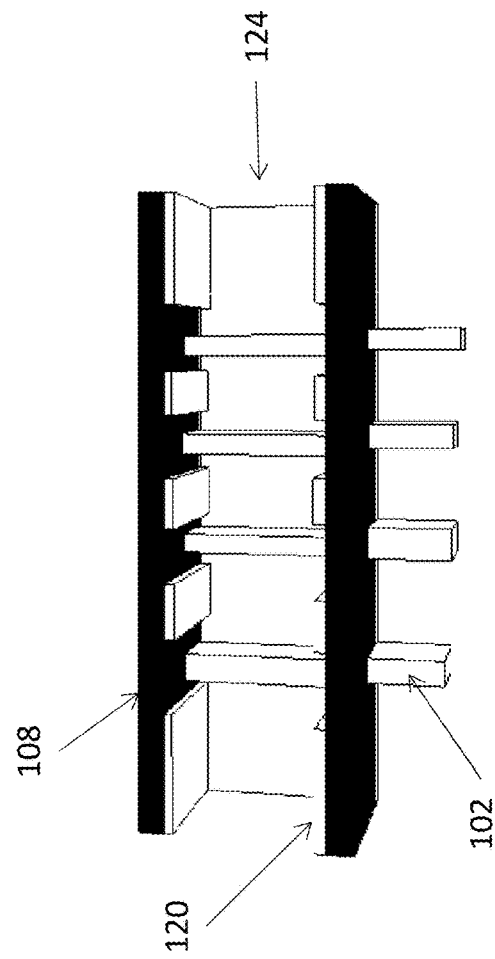

Also, FIGS. 15A and 15B are perspective schematic diagrams illustrating the continuous first spacer 108, the discontinuous second spacer 120, a location for the gate conductor 124, and the fins 102. As shown in FIGS. 15A and 15B the second insulating spacers 120 discontinuously contact the first insulating spacers 108 along the location for the gate conductors 124, such that the second spacer 120 (where present) is positioned between the gate conductors 124 and the first spacer 108.

Therefore, as shown above, various structure herein include (among other components) semiconductor fins 102 extending from a substrate 110, gate insulators 116 contacting channel regions 132 of the semiconductor fins 102, and gate conductors 124 positioned adjacent the channel regions 132 and contacting the gate insulators 116. Additionally, epitaxial source/drain material 130 contacts the semiconductor fins 102 on opposite sides of the channel regions 132, and source/drain conductive contacts 126 contact the epitaxial source/drain material 130.

Also, first insulating spacers 108 are on the gate conductors 124. The gate conductors 124 are parallel to the source/drain conductive contacts 126 and perpendicular to the semiconductor fins 102, and the first insulating spacers 108 are between the gate conductors 124 and the source/drain conductive contacts 126. Further, second insulating spacers 120 are on the first insulating spacers 108; however, the second insulating spacers 120 are only on the first insulating spacers 108 in locations between where the gate conductors 124 intersect the semiconductor fins 102. The first insulating spacers 108 and the second insulating spacers 120 are low-K insulators, and in different embodiments, the second insulating spacers 120 contact either the source/drain conductive contacts 126 or the gate conductors 124. Also, the first insulating spacers 108 and the second insulating spacers 120 can be either the same insulator, or different insulators.

Thus, both the first insulating spacers 108 and the second insulating spacers 120 separate the gate conductors 124 and the source/drain conductive contacts 126 in the locations between where the gate conductors 124 intersect the semiconductor fins 102, but only the first insulating spacers 108 separate the gate conductors 124 and the source/drain conductive contacts 126 in the locations where the gate conductors 124 intersect the semiconductor fins 102. The first insulating spacers 108 continuously contact the gate conductors 124 along full lengths of the gate conductors 124, and wherein the second insulating spacers 120 discontinuously contact the first insulating spacers 108 along the along full lengths of the gate conductors 124. The first insulating spacers 108 and the second insulating spacers 120 together cause a greater spacing between the gate conductors 124 and the source/drain conductive contacts 126, relative to the first insulating spacers 108 alone.

For purposes herein, a "semiconductor" is a material or structure that may include an implanted or in situ (e.g., epitaxially grown) impurity that allows the material to sometimes be a conductor and sometimes be an insulator, based on electron and hole carrier concentration. As used herein, "implantation processes" can take any appropriate form (whether now known or developed in the future) and can be, for example, ion implantation, etc. Epitaxial growth occurs in a heated (and sometimes pressurized) environment that is rich with a gas of the material that is to be grown.

For purposes herein, an "insulator" is a relative term that means a material or structure that allows substantially less (<95%) electrical current to flow than does a "conductor." The dielectrics (insulators) mentioned herein can, for example, be grown from either a dry oxygen ambient or steam and then patterned. The thickness of dielectrics herein may vary contingent upon the required device performance.

The conductors mentioned herein can be formed of any conductive material, such as polycrystalline silicon (polysilicon), amorphous silicon, a combination of amorphous silicon and polysilicon, and polysilicon-germanium, rendered conductive by the presence of a suitable dopant. Alternatively, the conductors herein may be one or more metals, such as tungsten, hafnium, tantalum, molybdenum, titanium, or nickel, or a metal silicide, any alloys of such metals, and may be deposited using physical vapor deposition, chemical vapor deposition, or any other technique known in the art.

There are various types of transistors, which have slight differences in how they are used in a circuit. For example, a bipolar transistor has terminals labeled base, collector, and emitter. A small current at the base terminal (that is, flowing between the base and the emitter) can control, or switch, a much larger current between the collector and emitter terminals. Another example is a field-effect transistor, which has terminals labeled gate, source, and drain. A voltage at the gate can control a current between source and drain. Within such transistors, a semiconductor (channel region) is positioned between the conductive source region and the similarly conductive drain (or conductive source/emitter regions), and when the semiconductor is in a conductive state, the semiconductor allows electrical current to flow between the source and drain, or collector and emitter. The gate is a conductive element that is electrically separated from the semiconductor by a "gate oxide" (which is an insulator); and current/voltage within the gate changes makes the channel region conductive, allowing electrical current to flow between the source and drain. Similarly, current flowing between the base and the emitter makes the semiconductor conductive, allowing current to flow between the collector and emitter.

A positive-type transistor "P-type transistor" uses impurities such as boron, aluminum or gallium, etc., within an intrinsic semiconductor substrate (to create deficiencies of valence electrons) as a semiconductor region. Similarly, an "N-type transistor" is a negative-type transistor that uses impurities such as antimony, arsenic or phosphorous, etc., within an intrinsic semiconductor substrate (to create excessive valence electrons) as a semiconductor region.

Generally, transistor structures are formed by depositing or implanting impurities into a substrate to form at least one semiconductor channel region, bordered by shallow trench isolation regions below the top (upper) surface of the substrate. A "substrate" herein can be any material appropriate for the given purpose (whether now known or developed in the future) and can be, for example, silicon-based wafers (bulk materials), ceramic materials, organic materials, oxide materials, nitride materials, etc., whether doped or undoped. The "shallow trench isolation" (STI) structures are generally formed by patterning openings/trenches within the substrate and growing or filling the openings with a highly insulating material (this allows different active areas of the substrate to be electrically isolated from one another).

A hardmask can be formed of any suitable material, whether now known or developed in the future, such as a nitride, metal, or organic hardmask, that has a hardness greater than the substrate and insulator materials used in the remainder of the structure.

When patterning any material herein, the material to be patterned can be grown or deposited in any known manner and a patterning layer (such as an organic photoresist) can be formed over the material. The patterning layer (resist) can be exposed to some pattern of light radiation (e.g., patterned exposure, laser exposure, etc.) provided in a light exposure pattern, and then the resist is developed using a chemical agent. This process changes the physical characteristics of the portion of the resist that was exposed to the light. Then one portion of the resist can be rinsed off, leaving the other portion of the resist to protect the material to be patterned (which portion of the resist that is rinsed off depends upon whether the resist is a negative resist (illuminated portions remain) or positive resist (illuminated portions are rinsed off). A material removal process is then performed (e.g., wet etching, anisotropic etching (orientation dependent etching), plasma etching (reactive ion etching (RIE), etc.)) to remove the unprotected portions of the material below the resist to be patterned. The resist is subsequently removed to leave the underlying material patterned according to the light exposure pattern (or a negative image thereof).

While only one or a limited number of transistors are illustrated in the drawings, those ordinarily skilled in the art would understand that many different types transistor could be simultaneously formed with the embodiment herein and the drawings are intended to show simultaneous formation of multiple different types of transistors; however, the drawings have been simplified to only show a limited number of transistors for clarity and to allow the reader to more easily recognize the different features illustrated. This is not intended to limit this disclosure because, as would be understood by those ordinarily skilled in the art, this disclosure is applicable to structures that include many of each type of transistor shown in the drawings.

The flowchart and block diagrams in the figures illustrate the architecture, functionality, and operation of possible implementations of devices and methods according to various embodiments. In this regard, each block in the flowchart or block diagrams may represent a module, segment, or portion of instructions, which includes one or more executable instructions for implementing the specified logical function(s). In some alternative implementations, the functions noted in the block may occur out of the order noted in the figures. For example, two blocks shown in succession may, in fact, be executed substantially concurrently, or the blocks may sometimes be executed in the reverse order, depending upon the functionality involved. It will also be noted that each block of the block diagrams and/or flowchart illustration, and combinations of blocks in the block diagrams and/or flowchart illustration, can be implemented by special purpose hardware-based systems that perform the specified functions or acts or carry out combinations of special purpose hardware and computer instructions.

The terminology used herein is for the purpose of describing particular embodiments only and is not intended to be limiting of the foregoing. As used herein, the singular forms "a," "an," and "the" are intended to include the plural forms as well, unless the context clearly indicates otherwise. Furthermore, as used herein, terms such as "right", "left", "vertical", "horizontal", "top", "bottom", "upper", "lower", "under", "below", "underlying", "over", "overlying", "parallel", "perpendicular", etc., are intended to describe relative locations as they are oriented and illustrated in the drawings (unless otherwise indicated) and terms such as "touching", "in direct contact", "abutting", "directly adjacent to", "immediately adjacent to", etc., are intended to indicate that at least one element physically contacts another element (without other elements separating the described elements). The term "laterally" is used herein to describe the relative locations of elements and, more particularly, to indicate that an element is positioned to the side of another element as opposed to above or below the other element, as those elements are oriented and illustrated in the drawings. For example, an element that is positioned laterally adjacent to another element will be beside the other element, an element that is positioned laterally immediately adjacent to another element will be directly beside the other element, and an element that laterally surrounds another element will be adjacent to and border the outer sidewalls of the other element.

Embodiments herein may be used in a variety of electronic applications, including but not limited to advanced sensors, memory/data storage, semiconductors, microprocessors and other applications. A resulting device and structure, such as an integrated circuit (IC) chip can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

While the foregoing has been described in detail in connection with only a limited number of embodiments, it should be readily understood that the embodiments herein are not limited to such disclosure. Rather, the elements herein can be modified to incorporate any number of variations, alterations, substitutions or equivalent arrangements not heretofore described, but which are commensurate with the spirit and scope herein. Additionally, while various embodiments have been described, it is to be understood that aspects herein may be included by only some of the described embodiments. Accordingly, the claims below are not to be seen as limited by the foregoing description. A reference to an element in the singular is not intended to mean "one and only one" unless specifically stated, but rather "one or more." All structural and functional equivalents to the elements of the various embodiments described throughout this disclosure that are known or later, come to be known, to those of ordinary skill in the art are expressly incorporated herein by reference and intended to be encompassed by this disclosure. It is therefore to be understood that changes may be made in the particular embodiments disclosed which are within the scope of the foregoing as outlined by the appended claims.

What is claimed is:

1. A structure comprising:
a substrate;
fins extending from the substrate;
gate conductors positioned adjacent channel regions of the fins;
source/drain material contacting the fins on opposite sides of the channel regions;
source/drain conductive contacts contacting the source/drain material;
first spacers on the gate conductors, wherein the gate conductors are linear conductors perpendicular to the fins, and wherein the first spacers are on both sides of the gate conductors; and
second spacers on the first spacers, wherein the second spacers are only on the first spacers in locations between where the gate conductors intersect the fins.

2. The structure according to claim 1, wherein the first spacers and the second spacers together cause a greater spacing between the gate conductors and the source/drain conductive contacts, relative to the first spacers alone.

3. The structure according to claim 1, wherein the first spacers and the second spacers comprise insulators.

4. The structure according to claim 1, wherein the first spacers continuously contact the gate conductors along full lengths of the gate conductors, and wherein the second spacers discontinuously contact the first spacers along the full lengths of the gate conductors.

5. The structure according to claim 1, wherein the second spacers contact either the source/drain conductive contacts or the gate conductors.

6. The structure according to claim 1, wherein the first spacers and the second spacers comprise either the same insulator, or different insulators.

7. A structure comprising:
a substrate;
semiconductor fins extending from the substrate;
gate insulators contacting channel regions of the semiconductor fins;

gate conductors positioned adjacent the channel regions and contacting the gate insulators;

epitaxial source/drain material contacting the semiconductor fins on opposite sides of the channel regions;

source/drain conductive contacts contacting the epitaxial source/drain material;

first insulating spacers on the gate conductors, wherein the gate conductors are linear conductors perpendicular to the semiconductor fins, and wherein the first insulating spacers are on both sides of the gate conductors; and second insulating spacers on the first insulating spacers, wherein the second insulating spacers are only on the first insulating spacers in locations between where the gate conductors intersect the semiconductor fins.

8. The structure according to claim 7, wherein both the first insulating spacers and the second insulating spacers separate the gate conductors and the source/drain conductive contacts in the locations between where the gate conductors intersect the semiconductor fins, and wherein only the first insulating spacers separate the gate conductors and the source/drain conductive contacts in the locations where the gate conductors intersect the semiconductor fins.

9. The structure according to claim 7, wherein the first insulating spacers and the second insulating spacers together cause a greater spacing between the gate conductors and the source/drain conductive contacts, relative to the first insulating spacers alone.

10. The structure according to claim 7, wherein the first insulating spacers and the second insulating spacers comprise low-K insulators.

11. The structure according to claim 7, wherein the first insulating spacers continuously contact the gate conductors along full lengths of the gate conductors, and wherein the second insulating spacers discontinuously contact the first insulating spacers along the full lengths of the gate conductors.

12. The structure according to claim 7, wherein the second insulating spacers contact either the source/drain conductive contacts or the gate conductors.

13. The structure according to claim 7, wherein the first insulating spacers and the second insulating spacers comprise either the same insulator, or different insulators.

14. A structure comprising:

a substrate;

fins extending from the substrate;

gate conductors positioned adjacent channel regions of the fins;

source/drain material contacting the fins on opposite sides of the channel regions;

source/drain conductive contacts contacting the source/drain material;

first spacers on the gate conductors, wherein the gate conductors are linear conductors perpendicular to the fins, and wherein the first spacers are on both sides of the gate conductors; and second spacers on the first spacers, wherein the second spacers are only on the first spacers in locations between where the gate conductors intersect the fins, wherein both the first spacers and the second spacers separate the gate conductors and the source/drain conductive contacts in the locations between where the gate conductors intersect the fins, and wherein only the first spacers separate the gate conductors and the source/drain conductive contacts in the locations where the gate conductors intersect the fins.

15. The structure according to claim 14, wherein the first spacers and the second spacers together cause a greater spacing between the gate conductors and the source/drain conductive contacts, relative to the first spacers alone.

16. The structure according to claim 14, wherein the first spacers and the second spacers comprise insulators.

17. The structure according to claim 14, wherein the first spacers continuously contact the gate conductors along full lengths of the gate conductors, and wherein the second spacers discontinuously contact the first spacers along the full lengths of the gate conductors.

18. The structure according to claim 14, wherein the second spacers contact either the source/drain conductive contacts or the gate conductors.

19. The structure according to claim 14, wherein the first spacers and the second spacers comprise either the same insulator, or different insulators.

\* \* \* \* \*